US011538790B2

(12) United States Patent
Ali et al.

(10) Patent No.: US 11,538,790 B2
(45) Date of Patent: Dec. 27, 2022

(54) EXTENDED HBM OFFSETS IN 2.5D INTERPOSERS (71) Applicant: Broadcom International Pte. Ltd., Singapore (SG)

(72) Inventors: Mohamed Anwar Ali, San Jose, CA (US); Thinh Quang Tran, San Jose, CA (US); Tauman T. Lau, San Jose, CA (US)

(73) Assignee: BROADCOM INTERNATIONAL PTE. LTD., Singapore (SG)

(*) Notice: Subject to any disclaimer, the term of this patent is extended or adjusted under 35 U.S.C. 154(b) by 0 days.

(21) Appl. No.: 17/491,072

(22) Filed: Sep. 30, 2021

(65) Prior Publication Data

US 2022/0302080 A1 Sep. 22, 2022

Related U.S. Application Data (60) Provisional application No. 63/164,480, filed on Mar. 22, 2021.

(51) Int. Cl.
*H01L 23/50* (2006.01)
*H01L 25/065* (2006.01)
*H01L 23/538* (2006.01)
*H01L 25/00* (2006.01)

(52) U.S. Cl.
CPC ...... *H01L 25/0655* (2013.01); *H01L 23/5386* (2013.01); *H01L 25/50* (2013.01)

(58) Field of Classification Search
None
See application file for complete search history.

(56) References Cited

U.S. PATENT DOCUMENTS

| | | | | |
|---|---|---|---|---|
| 2013/0078745 | A1* | 3/2013 | Wang | H01L 22/20 438/15 |
| 2017/0141065 | A1 | 5/2017 | Murai et al. | |
| 2019/0096825 | A1 | 3/2019 | Kim et al. | |
| 2019/0115269 | A1 | 4/2019 | Pan et al. | |
| 2020/0006252 | A1 | 1/2020 | Yu et al. | |
| 2020/0105639 | A1* | 4/2020 | Valavala | H01L 35/32 |
| 2020/0243464 | A1* | 7/2020 | Hsu | H01L 23/3677 |
| 2020/0343218 | A1* | 10/2020 | Hu | H01L 24/08 |
| 2021/0366873 | A1* | 11/2021 | Gandhi | H01L 24/92 |
| 2021/0391322 | A1* | 12/2021 | Chen | H01L 23/5384 |
| 2022/0196943 | A1* | 6/2022 | Li | G02B 6/4268 |

FOREIGN PATENT DOCUMENTS

| | | | | |
|---|---|---|---|---|
| TW | M600937 | U | * 9/2020 | |
| TW | 202145469 | A | * 12/2021 | G02B 6/12 |

OTHER PUBLICATIONS

Extended European Search Report from European Patent Application No. 22163232.6, dated Aug. 16, 2022, 12 pages.

\* cited by examiner

*Primary Examiner* — Michael Lebentritt
(74) *Attorney, Agent, or Firm* — BakerHostetler (57) ABSTRACT

A semiconductor package includes an interposer, a number of a first integrated circuit (IC) dies, one or more second IC dies, and one or more dummy dies. The first IC dies, the second IC dies and the dummy dies are implemented on the interposer. The dummy dies are configured to enable routing of pins of the first IC dies to selected circuits of the second IC dies while conforming to predefined routing rules.

20 Claims, 5 Drawing Sheets

EXTENDED HBM OFFSETS IN 2.5D INTERPOSERS

CROSS REFERENCE

This application claims benefit of priority to the provisional application No. 63/164,480. Filed on Mar. 22, 2021, which is incorporated by reference herein in its entirety.

TECHNICAL FIELD

The present description relates generally to Ethernet communications and, in particular, to extended high-bandwidth memory (HBM) offsets in 2.5 D interposers.

BACKGROUND

Semiconductor integration has evolved to placing integrated circuit (IC) devices side-by-side on a silicon or organic interposer. The interposer provides high-density connections between ICs typically along the facing edges of one another. In a 2.5 D interposer, unlike the 3D interposers, there is no stacking of dies on dies, but dies are packaged on the surface of a silicon interposer. The dies are incorporated into a single package in a single plane and are placed on the silicon interposer using a flip-chip technique. Commonly, the ICs used in 2.5 D interposers include custom application-specific ICs (ASICs) and high-bandwidth memories (HBMs).

Figure 1A:
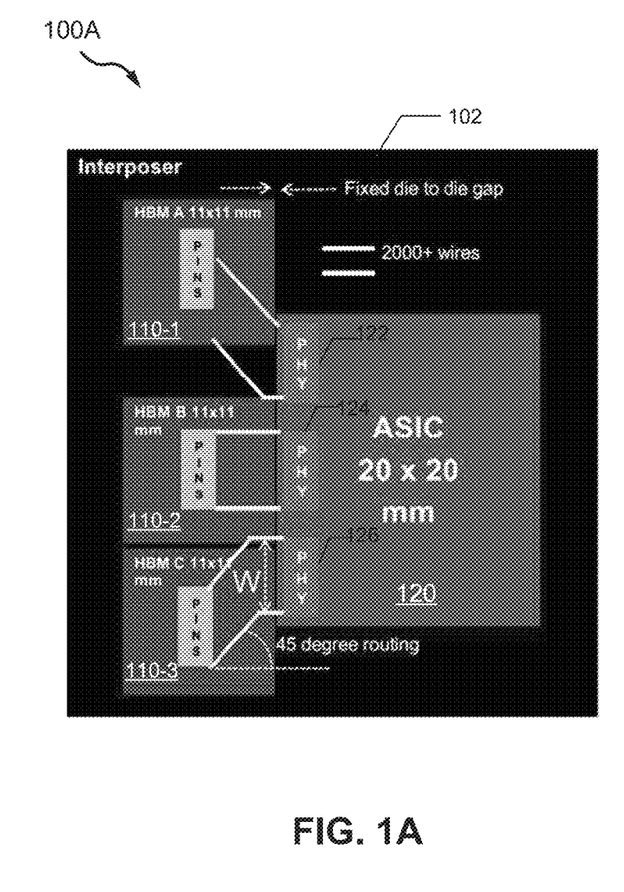
FIGS. 1A and 1B are diagrams illustrating examples of semiconductor integration schemes.
Figure 1B:
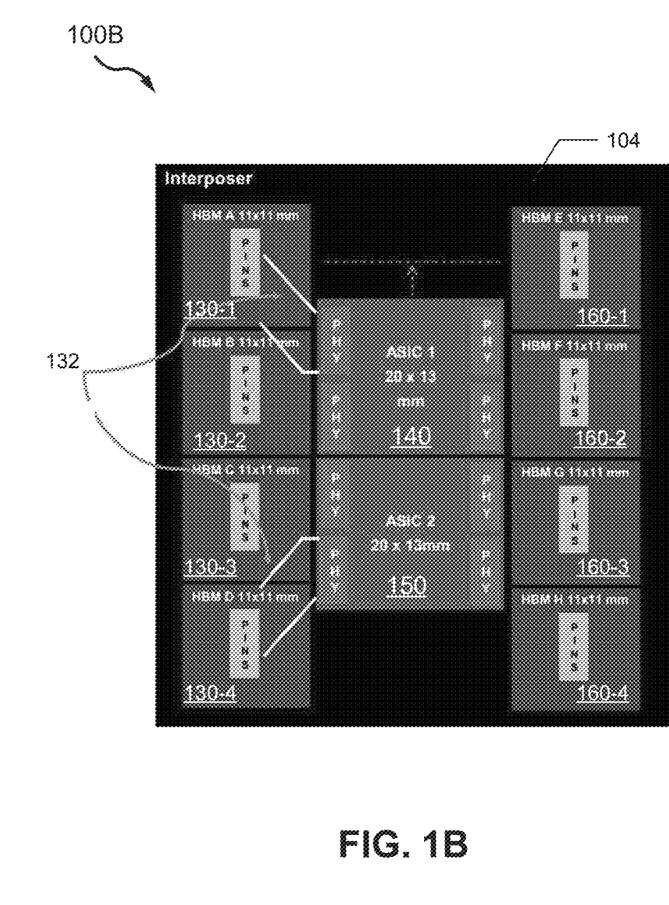

As shown in FIG. 1A, one or more HBM devices can be connected to an ASIC along a given edge of that ASIC. There are typically minimum and maximum spacing rules between dies, and there exist several thousands of connections between each HBM and its associated ASIC, which are routed in the interposer. It is common practice to center each HBM to its associated PHY circuit (e.g., transceiver) pins within the ASIC. This, however, is not always practical due to IC size mismatches; as a result, the HBM should be offset from corresponding pins on the ASIC (see. FIGS. 1A and 1B).

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

The subject technology is directed to methods and systems for providing integrated circuits with extended high-bandwidth memory (HBM) offsets in 2.5 D interposers. The disclosed solution inserts dummy dies between an application-specific integrated circuit (ASIC) and an HBM to increase the available escape region. This allows 45-degree routing to protract from the physical-layer (PHY) circuit (hereinafter, PHY) of the ASIC to HBM pins at extended offsets. In an inexpensive process appropriate to fill empty regions of the interposer, a metallic dummy die can be used to meet design rules. In some implementations, multiple dummy dies can be used. The dummy dies can be the same size or vary in size depending on the application. The die-to-die gap rules (e.g., requirements for the gaps between dies) can still be maintained while the subject technology is used.

The subject technology includes multiple advantageous features. For example, increased HBM offsets are possible, and the ASIC dimension does not need to grow in order to route to the HBMs. Further, the dummy die inserted between the ASIC and HBM increases the escape region, allowing routing to be completed. The routing may be 45 degrees or orthogonal routing, and any arbitrary offset is applicable as long as signal integrity is not affected. Other routing rules include metal min/max width, metal min/max spacing, and metal density (defined as the area of the metal as a proportion of the total available area). The subject technology can be used in any semiconductor integration using the 2.5 D interposers and is not limited to integrating HBMs and ASICs.

FIGS. 1A and 1B are diagrams illustrating examples of semiconductor integration schemes 100A and 100B. In the example semiconductor integration scheme 100A, three HBM dies 110 (110-1, 110-2 and 110-3) are integrated with an ASIC die 120 on an interposer 102. Each HBM die 110 has a size of 11×11 mm, and the ASIC die 120 has dimensions of 20×20 mm. The HBM dies 110 have to be connected to a PHY of the ASIC die 120. The connections (routing) of the pins of the HBM 110-2 to the PHY 124 have no issue, as it is centered with its corresponding PHY 124. The HBM dies 110-1 and 110-3 need to have an offset because of the large number of connection routings, which can be several thousands (e.g., more than 2,000) wires and need to spread over a finite width W. There is a geometric limit on the size of the offset that is set by a 45-degree routing rule projected from the HBM. For example, the HBM 110-3 can be routed to the PHY 126 using the 45-degree projection. However, the HBM die 110-1 cannot be routed as is seen from FIG. 1A. One solution is to increase the size of the ASIC die 120 so that the PHY 122 can be properly routed to the pins of the HBM die 110-1 using the 45-degree routing. This solution increases the chip area and manufacturing cost, and in some situations may not even be possible to implement, for example, when there are restrictions on the ASIC reticle (negative mask) field. The subject technology solves this problem as discussed herein.

FIG. 1B shows the semiconductor integration scheme 100B, an example of integration of multiple ASIC dies with multiple HBM dies. In this example, the ASIC dies 140 and 150 are supposed to be integrated with the HBM dies 130 (130-1, 130-2, 130-3 and 130-4) on one side and the HBM dies 160 (160-1, 160-2, 160-3 and 160-4) on the other side. The HBM dies 130-2, 130-3, 160-2 and 160-3 are centered with their corresponding PHYS of the ASIC dies 140 and 150 and can be routed properly. However, the routings 132 of the HBM dies 130-1, 130-4 and similarly the routings of the HBM dies 160-1 and 160-4 have similar issues as explained above with respect the FIG. 1A. The disclosed techniques of the subject technology provide solutions for different scenarios without having to increase the ASIC sizes, as discussed below.

Figure 2:
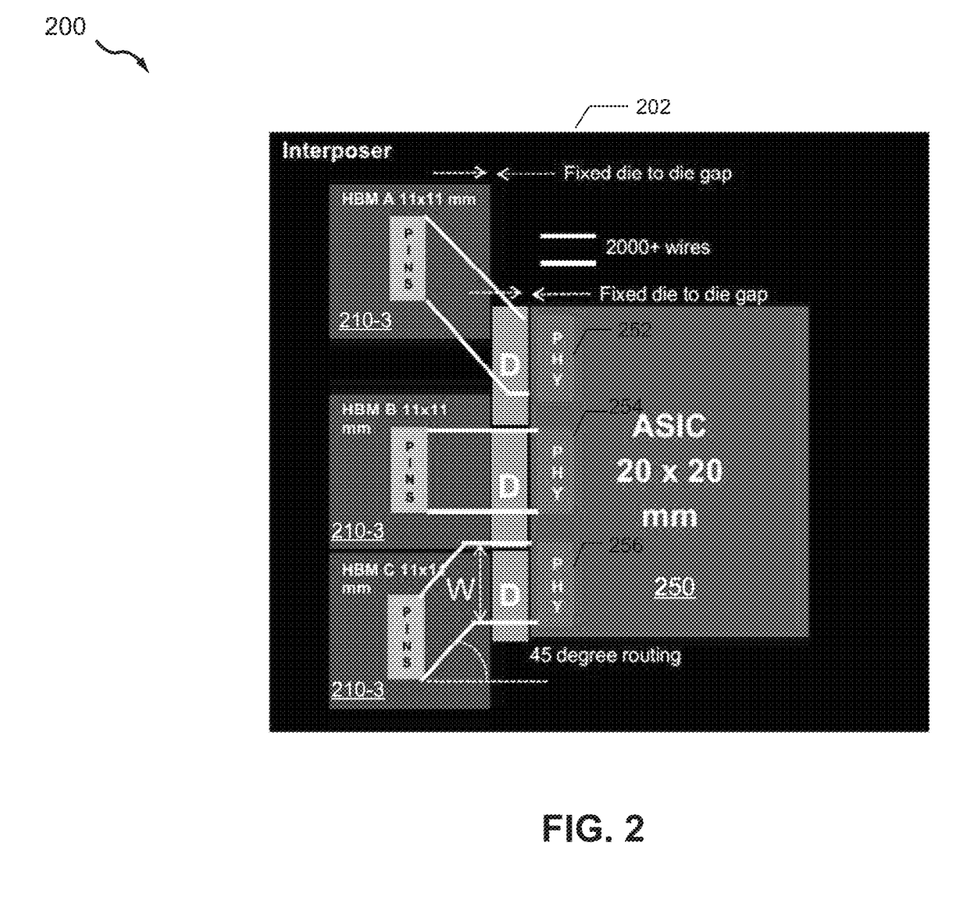
FIG. 2 is a diagram illustrating an example of a semiconductor integration scheme, according to various aspects of the subject technology.

FIG. 2 is a diagram illustrating an example of a semiconductor integration scheme 200, according to various aspects of the subject technology. In the semiconductor integration scheme 200, a number of first integrated circuit (IC) dies such as the HBM dies 210 (210-1, 210-2 and 210-3) are integrated with a second IC die such as an ASIC die 250. The HBM dies 210 and the ASIC die 250 are similar to the HBM dies 110 and the ASIC die 120 of FIG. 1A and are integrated on an interposer 202. The additional feature of the subject technology are the dummy dies D, which are inserted between in the HBM dies 210 and the ASIC die 250 on a metal layer of the interposer 202.

The dummy dies D increase the ASIC-to-HBM available routing region to allow 45-degree routing to protract from the pins of the HBM die 210-1 to a corresponding PHY 252, which was not possible without the dummy die D, as discussed above with respect to FIG. 1A. The routing from pins of the HBM dies 210-2 and 210-3 to the corresponding PHYs 254 and 256 of the ASIC die 250 are also realized on their corresponding dummy dies D. In some aspects, the dummy dies D can be implemented as a single dummy die. In some implementations, the size of the dummy dies can vary to maintain the die-to-die gap rules. In some implementations, the dummy dies D can be realized by using a metal such as aluminum, copper or other suitable materials.

Figure 3:
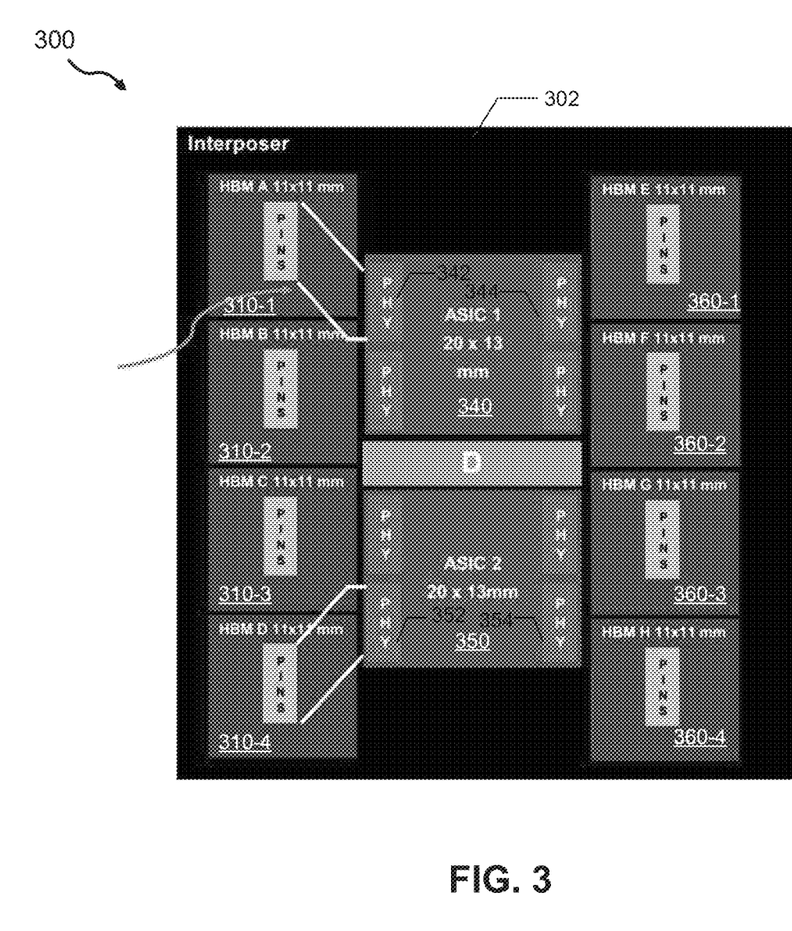
FIG. 3 is a diagram illustrating an example of a semiconductor integration scheme, according to various aspects of the subject technology.

FIG. 3 is a diagram illustrating an example of a semiconductor integration scheme 300, according to various aspects of the subject technology. In the semiconductor integration scheme 300, a number of first integrated circuit (IC) dies such as HBM dies 310 (310-1, 310-2 and 310-3) and HBM dies 360 (360-1, 360-2 and 360-3) are integrated with one or more second IC dies such as an ASIC dies 340 and 350. The HBM dies 310 and 360 and the ASIC die 340 and 350 are similar to the HBM dies 130 and 160 and the ASIC dies 140 and 150 of FIG. 1B and are integrated on an interposer 302. The additional feature of the subject technology is a dummy die D, which is inserted between the ASIC dies 340 and 350 on a metal layer of the interposer 302.

The dummy die D increases the ASIC-to-ASIC space, which results in providing sufficient available routing region to allow 45-degree routing to protract from the pins of the HBM dies 310-1 and 310-4 to their corresponding PHY 342 and 352. Similarly, the dummy die D provides sufficient available routing region to allow 45-degree routing to protract from the pins of the HBM dies 360-1 and 360-4 to their corresponding PHY 344 and 354. In some aspects, the dummy die D can be implemented as a single metal dummy die. In some implementations, the size of the dummy die D can vary to maintain the die-to-die gap rules. In some implementations, the dummy die D can be realized by using a metal such as aluminum, copper or other suitable materials.

As described above with the example implementations of FIGS. 2 and 3, the subject technology uses dummy dies at suitable places on the interposer to increase the offset between the dies (e.g., HBM dies and ASIC dies). This allows 45-degree routing for corner dies without increasing the dimensions of the dies such as the ASIC dies, which was not possible without the dummy dies of the subject technology. In some implementations, some of the routings can be orthogonal routing instead of the 45-degree routing, depending on the geometrical configuration of the dies on the interposer. The disclosed technique allows routing with any arbitrary die-to-die offset distance as long as the signal integrity can be preserved. Accordingly, the disclosed technology enables larger die-to-die (e.g., HBM dies to ASIC die) offset and/or smaller die (e.g., ASIC die) dimensions.

Figure 4:
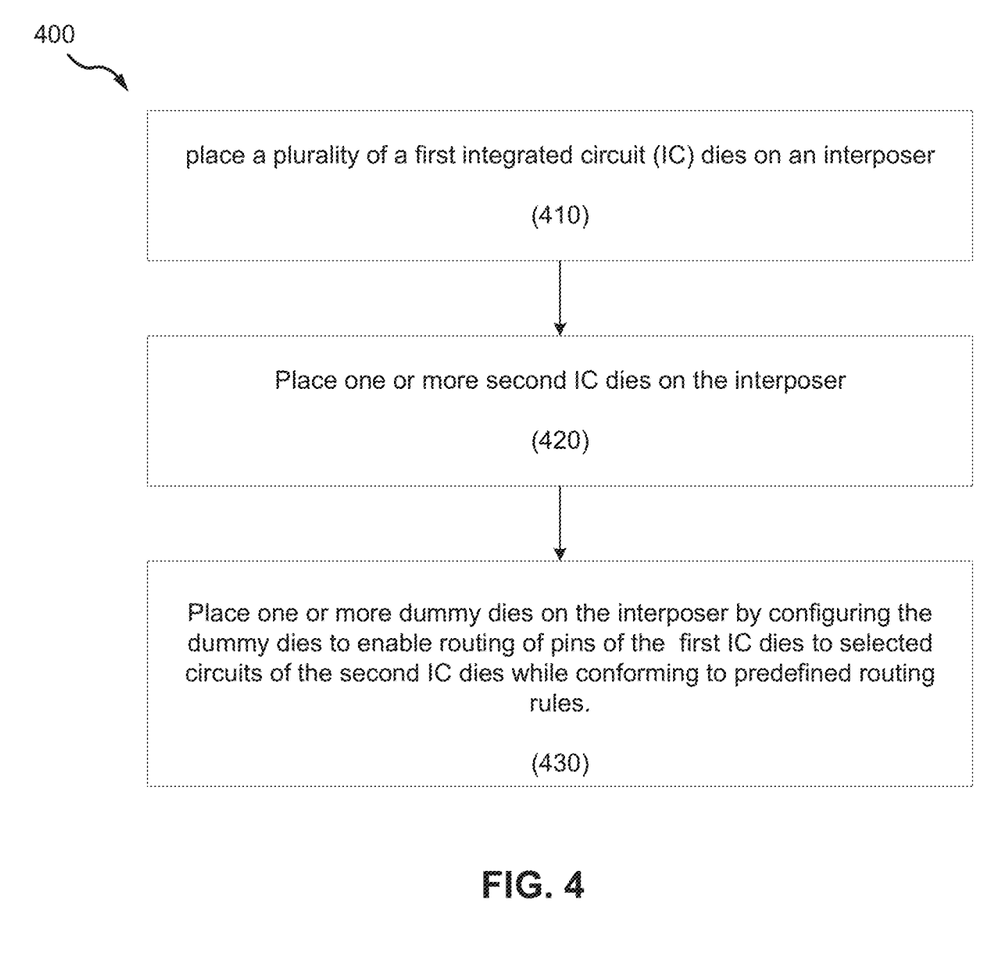
FIG. 4 is a flow diagram illustrating an example of a method of semiconductor integration, in accordance with some aspects of the subject technology.

FIG. 4 is a flow diagram illustrating an example of a method 400 of semiconductor integration, in accordance with some aspects of the subject technology. The method 400 includes placing a number of a first IC dies (e.g., 210 of FIG. 2) on an interposer (e.g., 202 of FIG. 2) (410). The method also includes placing one or more second IC dies (e.g., 250 of FIG. 2) on the interposer (420). The method further includes placing one or more dummy dies (e.g., D of FIG. 2) on the interposer by configuring the dummy dies to enable routing of pins of the first IC dies to selected circuits of the second IC dies while conforming to predefined routing rules (430).

Figure 5:
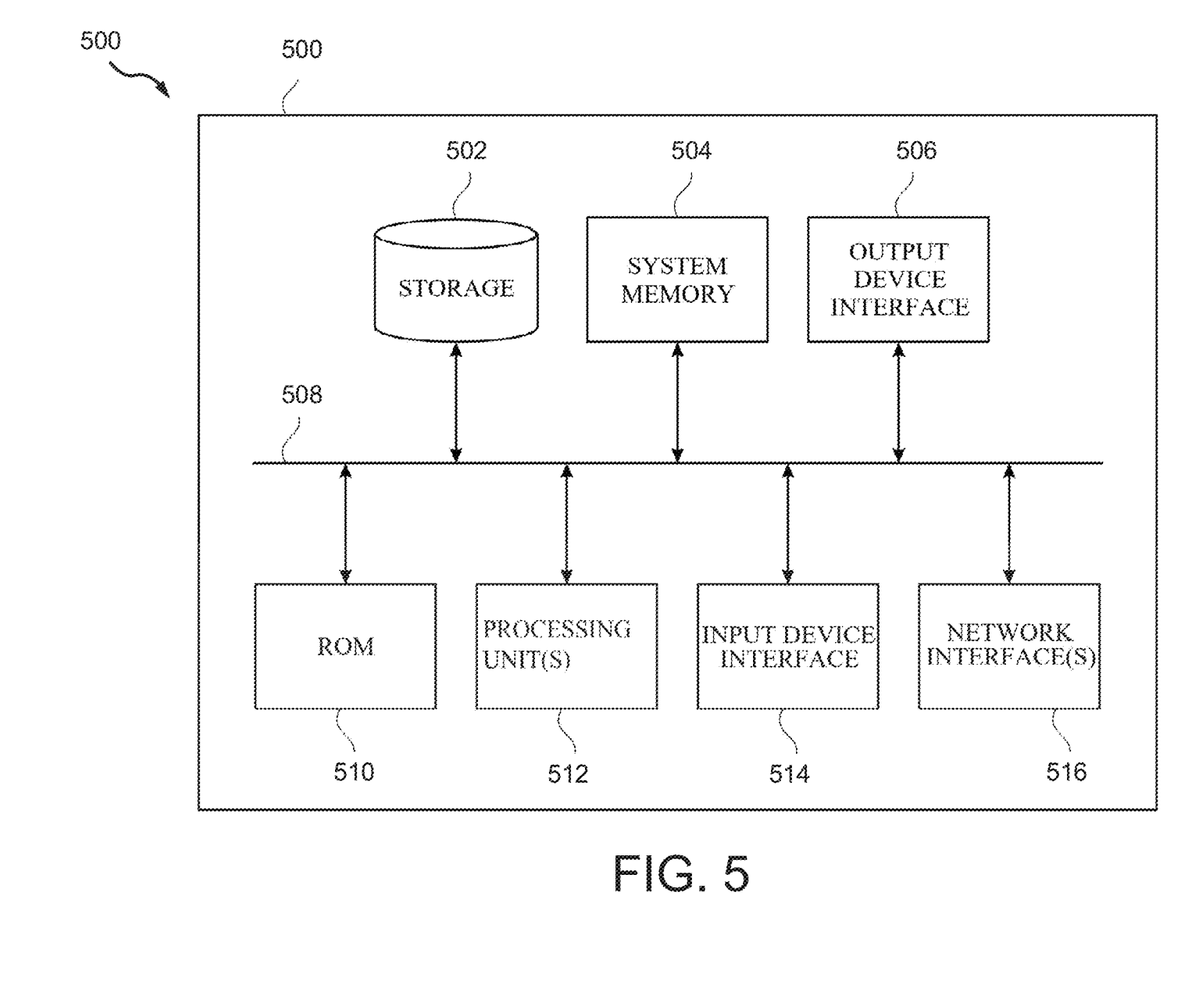
FIG. 5 is an electronic system within which some aspects of the subject technology may be implemented.

FIG. 5 is an electronic system within which some aspects of the subject technology may be implemented. The electronic system 500 can be, and/or can be a part of, a portable communication device such as a smart phone, a smart watch or a tablet, a desktop computer or the network switch, for example, of a data center or an enterprise network. The electronic system 500 may include various types of computer readable media and interfaces for various other types of computer readable media. The electronic system 500 includes a bus 508, one or more processing unit(s) 512, a system memory 504 (and/or buffer), a ROM 510, a permanent storage device 502, an input device interface 514, an output device interface 506, and one or more network interfaces 516, or subsets and variations thereof.

The bus 508 collectively represents all system, peripheral, and chipset buses that communicatively connect the numerous internal devices of the electronic system 500. In one or more implementations, the bus 508 communicatively connects the one or more processing unit(s) 512 with the ROM 510, the system memory 504, and the permanent storage device 502. From these various memory units, the one or more processing unit(s) 512 retrieves instructions to execute and data to process in order to execute the processes of the subject disclosure. The one or more processing unit(s) 512 can be a single processor or a multi-core processor in different implementations. In one or more aspects, the one or more processing unit(s) 512 may be used to execute instructions to cause performance of the method 4 of FIG. 4.

The ROM 510 stores static data and instructions that are needed by the one or more processing unit(s) 512 and other modules of the electronic system 500. The permanent storage device 502, on the other hand, may be a read-and-write memory device. The permanent storage device 502 may be a nonvolatile memory unit that stores instructions and data even when the electronic system 500 is off. In one or more implementations, a mass-storage device (such as a magnetic or optical disk and its corresponding disk drive) may be used as the permanent storage device 502.

In one or more implementations, a removable storage device such as a floppy disk, flash drive and its corresponding disk drive) may be used as the permanent storage device 502. Similar to the permanent storage device 502, the system memory 504 may be a read-and-write memory device. However, unlike the permanent storage device 502, the system memory 504 may be a volatile read-and-write memory, such as random-access memory (RAM). The system memory 504 may store any of the instructions and data that one or more processing unit(s) 512 may need at runtime. In one or more implementations, the processes of the subject disclosure are stored in the system memory 504, the permanent storage device 502 and/or the ROM 510. From these various memory units, the one or more processing unit(s) 512 retrieves instructions to execute and data to process in order to execute the processes of one or more implementations.

The bus 508 also connects to the input and output device interfaces 514 and 506. The input device interface 514 enables a user to communicate information and select commands to the electronic system 500. Input devices that may be used with the input device interface 514 may include, for example, alphanumeric keyboards and pointing devices (also called "cursor control devices"). The output device interface 506 may enable, for example, the display of images generated by electronic system 500. Output devices that may be used with the output device interface 506 may include, for example, printers and display devices, such as a liquid crystal display, a light emitting diode display, an organic light emitting diode display, a flexible display, a flat panel display, a solid state display, a projector or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech or tactile input.

Finally, as shown in FIG. 5, the bus 508 also couples the electronic system 500 to one or more networks and/or to one or more network nodes, through the one or more network interface(s) 516. In this manner, the electronic system 500 can be a part of a network of computers (such as a local area network or a wide area network), an intranet, or a network of networks (such as the internet). Any or all components of the electronic system 500 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be nontransitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG and Millipede memory.

Further, the computer-readable storage medium can include any nonsemiconductor memory, such as optical disk storage, magnetic disk storage, magnetic tape, other magnetic storage devices or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections or any combination thereof.

Instructions can be directly executable or can be used to develop executable instructions. For example, instructions can be realized as executable or nonexecutable machine code or as instructions in a high-level language that can be compiled to produce executable or nonexecutable machine code. Further, instructions also can be realized as or can include data. Computer-executable instructions also can be organized in any format, including routines, subroutines, programs, data structures, objects, modules, applications, applets and functions, etc. As recognized by those of skill in the art, details including, but not limited to, the number, structure, sequence, and organization of instructions can vary significantly without varying the underlying logic, function, processing and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Those of skill in the art would appreciate that the various illustrative blocks, modules, elements, components, methods and algorithms described herein may be implemented as electronic hardware, computer software or combinations of both. To illustrate this interchangeability of hardware and software, various illustrative blocks, modules, elements, components, methods and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology. Further, various functional blocks need not be connected directly (even though, for convenience, they are illustrated that way in the figures).

It is understood that any specific order or hierarchy of blocks in the processes disclosed is an illustration of example approaches. Based upon design preferences, it is understood that the specific order or hierarchy of blocks in the processes may be rearranged, or that not all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B or only C; any combination of A, B and C; and/or at least one of each of A, B and C.

The predicate words "configured to," "operable to," and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure" and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have" or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A semiconductor package comprising:
   an interposer;
   a plurality of a first integrated circuit (IC) dies;
   one or more second IC dies; and
   one or more dummy dies,
   wherein the plurality of the first IC dies, the one or more second IC dies and the one or more dummy dies are implemented on the interposer, and wherein the one or more dummy dies are configured to enable routing of pins of the plurality of first IC dies to selected circuits of the one or more second IC dies while conforming to predefined routing rules.

2. The semiconductor package of claim 1, wherein the plurality of the first IC dies comprise a plurality of high-bandwidth memory (HBM) dies.

3. The semiconductor package of claim 1, wherein the one or more second IC dies comprise one or more application-specific integrated circuit (ASIC) dies.

4. The semiconductor package of claim 3, wherein the selected circuits of the one or more second IC dies comprise physical layer (PHY) circuits of the one or more ASIC dies.

5. The semiconductor package of claim 1, wherein the one or more dummy dies are placed between the plurality of the first IC dies and the one or more second IC dies.

6. The semiconductor package of claim 1, wherein the one or more dummy dies are placed in between the one or more second IC dies.

7. The semiconductor package of claim 6, wherein the one or more dummy dies comprise metallic dies implemented in a metal layer of the interposer.

8. The semiconductor package of claim 7, wherein the one or more dummy dies vary in dimensions.

9. The semiconductor package of claim 7, wherein the predefined routing rules comprise 45-degree and orthogonal routing rules.

10. The semiconductor package of claim 1, wherein the one or more dummy dies are configured to enable routing with various amounts of offsets between the plurality of first IC dies and the one or more second IC dies.

11. A method of packaging semiconductor dies, the method comprising:
    placing a plurality of a first integrated circuit (IC) dies on an interposer;
    placing one or more second IC dies on the interposer; and
    placing one or more dummy dies on the interposer,
    wherein placing the one or more dummy dies comprises configuring the one or more dummy dies to enable routing of pins of the plurality of first IC die to selected circuits of the one or more second IC dies while conforming to predefined routing rules.

12. The method of claim 11, wherein the plurality of the first IC dies comprise a plurality of high-bandwidth memory (HBM) dies, and wherein the one or more second IC dies comprise one or more application-specific integrated circuit (ASIC) dies.

13. The method of claim 11, wherein placing the one or more dummy dies comprises placing the one or more dummy dies in-between the one or more second IC dies.

14. The method of claim 11, wherein placing the one or more dummy dies comprises placing the one or more dummy dies between the plurality of the first IC dies and the one or more second IC dies.

15. The method of claim 11, wherein placing the one or more dummy dies comprises placing one or more metallic dies in a metal layer of the interposer.

16. The method of claim 11, wherein conforming to the predefined routing rules comprises conforming to 45-degree and orthogonal routing rules.

17. The method of claim 11, further comprising configuring the one or more dummy dies to enable routing with various amounts of offsets between the plurality of first IC dies and the one or more second IC dies.

18. An interposer with extended high-bandwidth memory (HBM) offsets, the interposer comprising:
   a plurality of HBM dies;
   two or more application-specific integrated circuits (ASICs); and
   one or more dummy dies placed on the interposer,
   wherein sizes and placement locations of one or more dummy dies are configured to enable routing of pins of the plurality of HBM dies to selected circuits of the one or more ASIC dies while conforming to predefined routing rules; and wherein the one or more dummy dies are placed at the configured placement locations on the interposer.

19. The interposer of claim 18, wherein the configured placement locations on the interposer comprise in-between the two or ASICs, and wherein placement of the one or more dummy dies comprises placement of one or more metallic dies in a metal layer of the interposer.

20. The interposer of claim 18, the configured placement locations on the interposer comprise in-between the plurality of HBM dies and the two or more ASIC dies, and wherein conforming to the predefined routing rules comprises conforming to 45-degree and orthogonal routing rules.

* * * * *